United States Patent
Kaszynski (12) United States Patent (10) Patent No.: US 7,279,987 B1
Kaszynski (45) Date of Patent: Oct. 9, 2007

(54) METHOD, APPARATUS AND PROGRAM STORAGE DEVICE FOR MODELING AN ANALOG PLL FOR USE IN A DIGITAL SIMULATOR

(75) Inventor: Robert J. Kaszynski, Mendota Heights, MN (US)

(73) Assignee: Xilinx, Inc., San Jose, CA (US)

( * ) Notice: Subject to any disclaimer, the term of this patent is extended or adjusted under 35 U.S.C. 154(b) by 293 days.

(21) Appl. No.: 11/021,864

(22) Filed: Dec. 23, 2004

(51) Int. Cl.
*H03L 7/00* (2006.01)

(52) U.S. Cl. ........................ 331/1 A; 331/16; 331/34; 716/1; 716/16; 716/18

(58) Field of Classification Search ................ 716/18, 716/16, 1; 331/1 A, 16, 34
See application file for complete search history.

(56) References Cited

U.S. PATENT DOCUMENTS 6,704,908 B1 * 3/2004 Horan et al. .................... 716/1
7,065,734 B2 * 6/2006 Dalton ......................... 716/18

\* cited by examiner

*Primary Examiner*—Arnold Kinkead
(74) *Attorney, Agent, or Firm*—LeRoy D. Maunu (57) ABSTRACT

A method, apparatus and program storage device for modeling an analog PLL for use in a digital simulator are disclosed. A model of a phase locked loop to be simulated in a digital simulator includes a behavioral model for simulating a phase locked loop as a set of behavioral blocks based upon a high level description language and a loop filter model, used by the behavioral model, the loop filter model being implemented as a series of integrators based on a transfer function for creating a loop voltage for generating phase adjustments. The PLL behavior is based on actual circuit parameters and produces accurate behavior in a fraction of the time required using an analog simulator.

13 Claims, 7 Drawing Sheets

METHOD, APPARATUS AND PROGRAM STORAGE DEVICE FOR MODELING AN ANALOG PLL FOR USE IN A DIGITAL SIMULATOR

FIELD OF THE INVENTION

This disclosure relates in general to software modeling, and more particularly to a method, apparatus and program storage device for modeling an analog PLL for use in a digital simulator.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

Today, there are new mixed-signal and multi-level simulation languages, which can accurately represent the analog portion of the mixed circuits with behavioral models. Behavioral models are used to describe the analog circuit's behavior on the basis that an input signal to a known system will produce a predictable response signal. Thus, if a function for the input signal vs. output signal is derived, the behavior of the circuit can be predicted without having a full circuit or device level model. Typically, the simulator involves complex mathematical functions having multiple parameters of the input signal necessary to derive the output response.

As FPGAs grow in size, quality on-chip clock distribution becomes increasingly important. Clock skew and clock delay impact device performance and the task of managing clock skew and clock delay becomes more difficult in large devices. Multi-gigabit transceivers (MGTs) are now being included on programmable logic devices (PLDs), such as a field programmable gate array (FPGA). A multi-gigabit transceiver locks to an input data stream through a Clock and Data Recovery (CDR) circuit.

The transceiver includes a phase locked loop (PLL) in the receiver side and in the transmitter side. During normal operation, the receiver PLL automatically locks to incoming data (when present) or to the local reference clock (when data is not present). PLLs may also be used to provide some additional functionality such as frequency synthesis (clock multiplication and clock division) and clock conditioning (duty cycle correction and phase shifting).

Depending on the signal type and functional elements used the PLL can be classified as analogue, discrete, digital or mixed system. However, PLLs are most often implemented using either analog or digital circuitry. Each method has its own advantages. For example, an analog implementation with careful design can produce a PLL with finer timing resolution. Analog implementations can additionally take less silicon area. Conversely, digital implementations offer advantages in noise sensitivity, lower power consumption and jitter performance.

Streamlining the simulation of entire complex system environments, from chip, to package, to board, to connector, to backplane, and back again to chip, has become one of the most urgent needs of designers today. Analog phase locked loop (PLL) performance is verified using analog simulators that are typically too slow to simulate large or complex circuits such as analog phase locked loops. Moreover, faster analog simulators are required to provide accurate simulation of an analog PLL.

It can be seen then that there is a need for a method, apparatus and program storage device for accurately modeling an analog PLL for use in a high speed digital simulator.

SUMMARY

To overcome the limitations described above, and to overcome other limitations that will become apparent upon reading and understanding the present specification, the present invention discloses a method, apparatus and program storage device for accurately modeling an analog PLL for use in a high speed digital simulator.

The present invention solves the above-described problems by modeling the PLL behavior using actual circuit parameters and producing accurate behavior in a fraction of the time required using an analog simulator. The model may be written in a high level description language, such as Verilog HDL or VHDL or C or C++.

An embodiment according of the present invention provides a model of a phase locked loop to be simulated in a digital simulator and includes a behavioral model for simulating a phase locked loop as a set of behavioral blocks based upon a high level description language and a loop filter model, used by the behavioral model, the loop filter model being implemented as a series of integrators based on a transfer function for creating a loop voltage for generating phase adjustments.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method, apparatus and program storage device for accurately modeling an analog PLL for use in a high speed digital simulator. PLL behavior is modeled using actual circuit parameters and accurate behavior is produced in a fraction of the time required using an analog simulator. The model may be written in a high level description language, such as, for example, a hardware description language.

Figure 1:
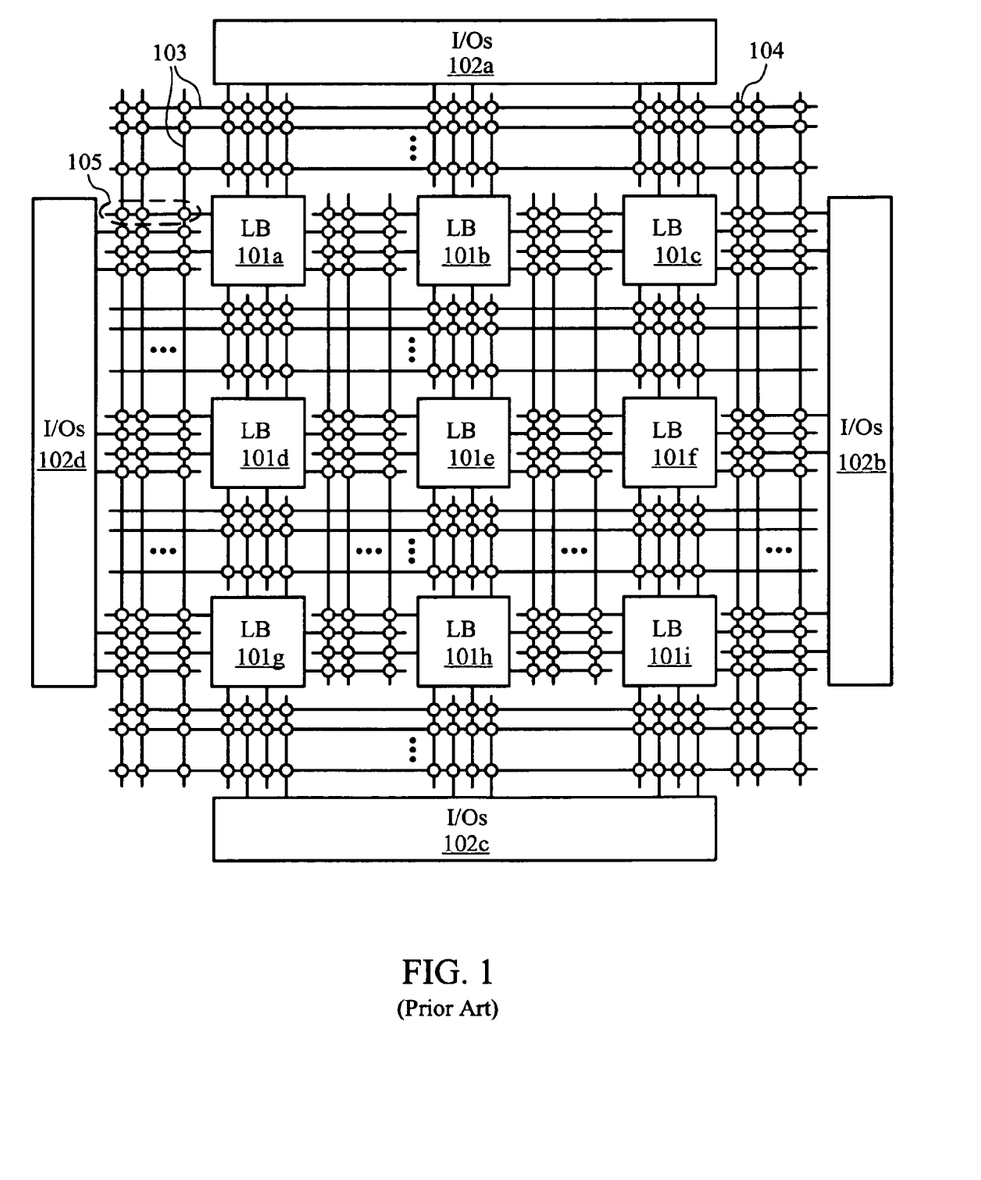
FIG. 1 is a simplified illustration of an exemplary FPGA.

FIG. 1 is a simplified illustration of an exemplary FPGA. The FPGA of FIG. 1 includes an array of configurable logic blocks (LBs 101a-101i) and programmable input/output blocks (I/Os 102a-102d). The LBs and I/O blocks are interconnected by a programmable interconnect structure that includes a large number of interconnect lines 103 interconnected by programmable interconnect points (PIPs 104, shown as small circles in FIG. 1). PIPs are often coupled into groups (e.g., group 105) that implement multiplexer circuits selecting one of several interconnect lines to provide a signal to a destination interconnect line or logic block. Some FPGAs also include additional logic blocks with special purposes (not shown), e.g., MGTs, DLLs, RAM, and so forth.

Figure 2:
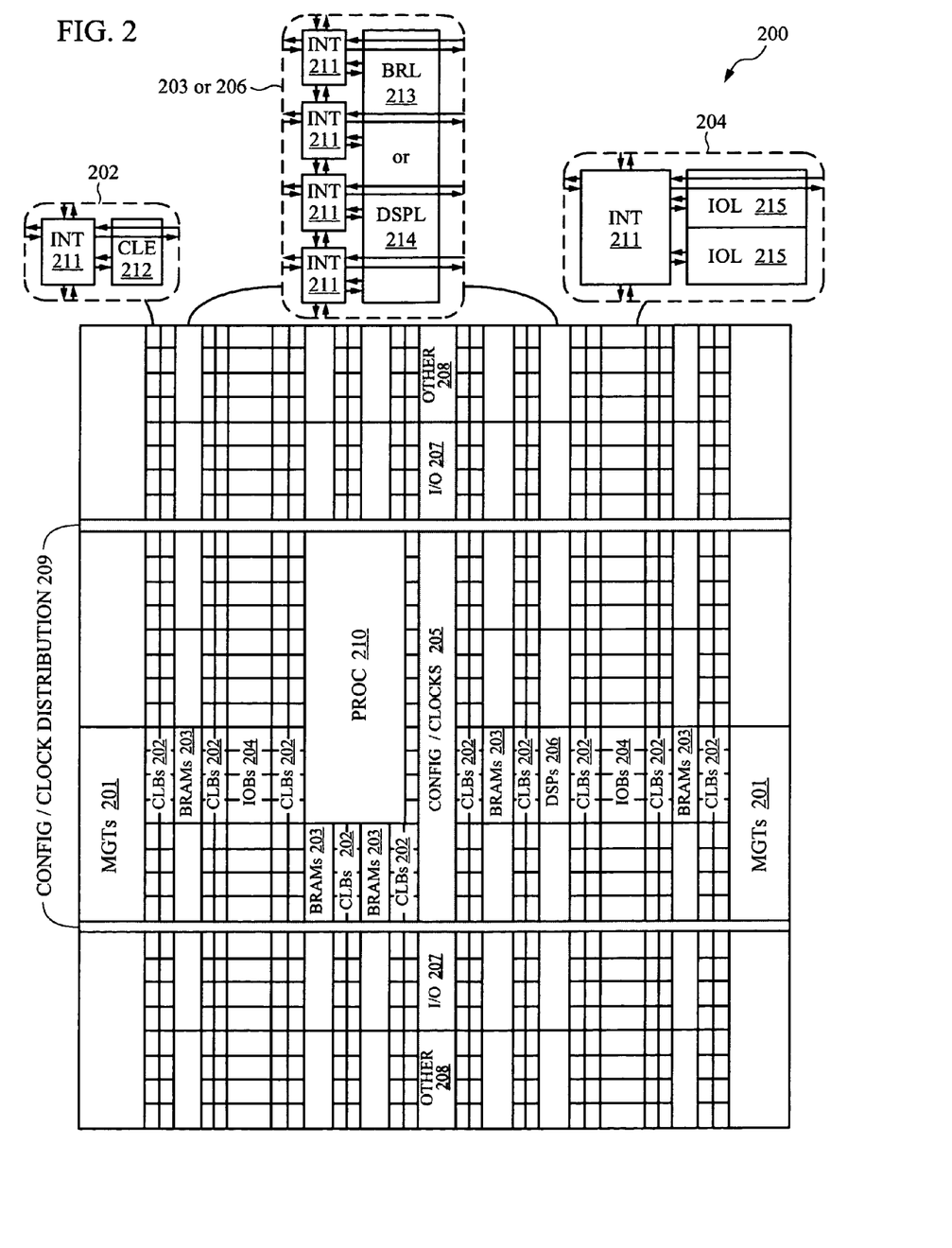
FIG. 2 illustrates an FPGA architecture according to an embodiment of the present invention.

FIG. 2 illustrates an FPGA architecture 200 according to an embodiment of the present invention. As noted above, advanced FPGAs can include several different types of programmable logic blocks in the array. For example, in FIG. 2, the FPGA architecture 200 includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210). An MGT includes a phase lock loop (PLL), which has a structure like FIG. 3; hence a PLL model is needed to simulate the PLLs in the MGTs 201 of FPGA 200.

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An 10B 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs. Configuration logic 205 allows configuration data values to be loaded into the FPGA architecture 200.

Note that FIG. 2 is intended to illustrate only one example of an FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

Figure 3:
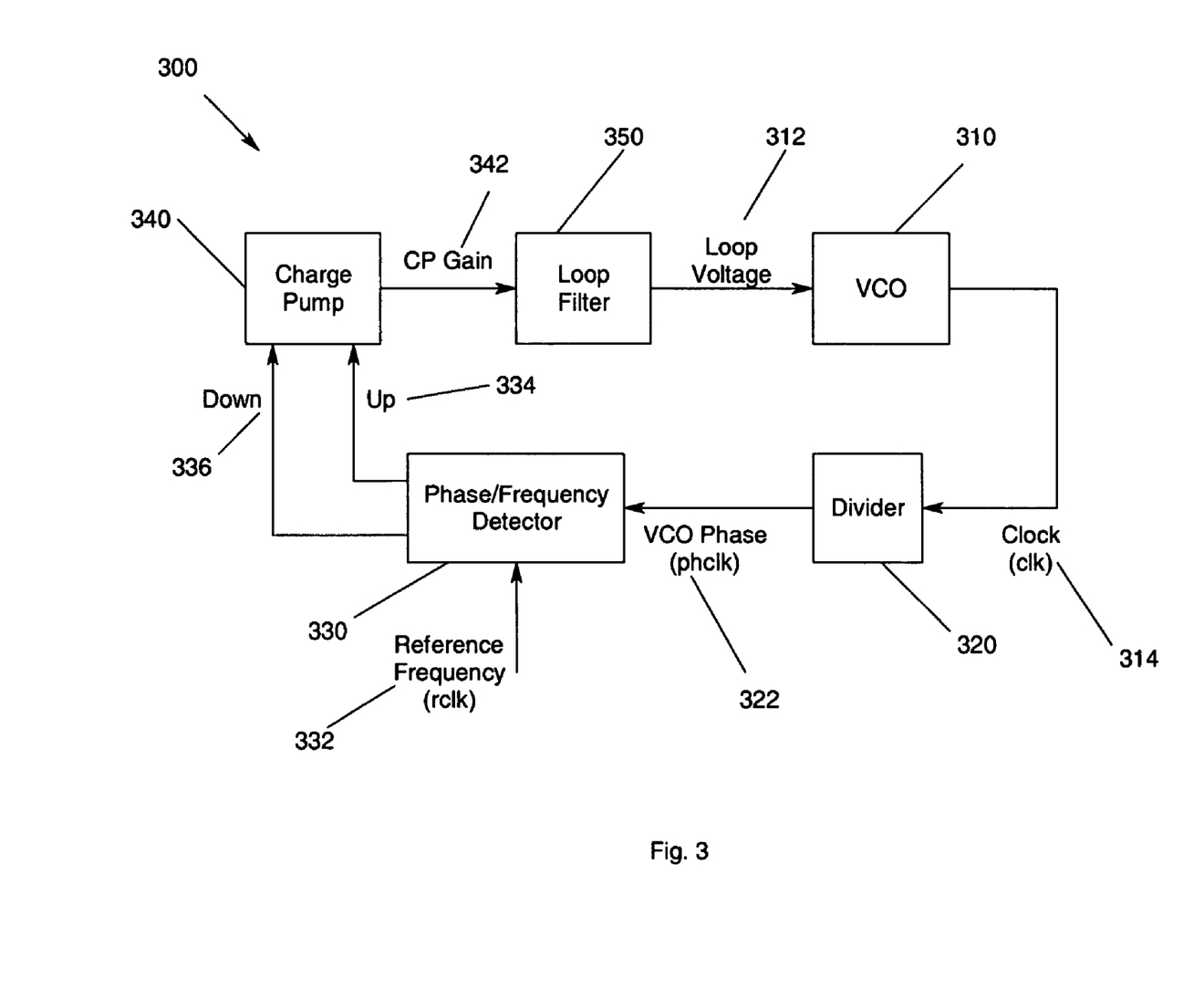
FIG. 3 is a block diagram of a phase locked loop model (PLL) according to an embodiment of the present invention.

FIG. 3 is a block diagram 300 of a phase locked loop model (PLL) according to an embodiment of the present invention. The model of the phase locked loop (PLL) illustrated in FIG. 3 utilizes a digital simulator and digital signal processing techniques that delivers accurate results at high speed. The block diagram of the phase locked loop model (PLL) includes 5 blocks. The voltage controlled oscillator (VCO) block 310 is a simple integrator that begins at a value of 1.0 and steps down until its value reaches the loop voltage 312 where it causes the output clock (clk) 314 to change state. The output clock signal 314 is divided by the divider 320 to create the VCO phase indication (phclk) 322. The phase/frequency detector 330 compares the phase of the reference signal (rclk) 332 and the phase indication signal 322 and produces the necessary Up (up) 334 and Down (dn) 336 signals to the charge pump 340. The charge pump 340 produces a real number, CP GAIN 342, that represents the magnitude and direction of the output current.

The loop filter 350 is implemented as a series of integrators that is based on the transfer function of the filter that creates the loop voltage 312 based on the incoming charge pump signal, CP GAIN 342. The loop filter 350 provides the loop voltage 312 to the VCO 310, wherein the VCO 310 generates the clock signal 314. An example of Verilog code for the PLL model 300 of an embodiment of the present invention is given in the Appendix, which is herein incorporated by reference.

Figure 4:
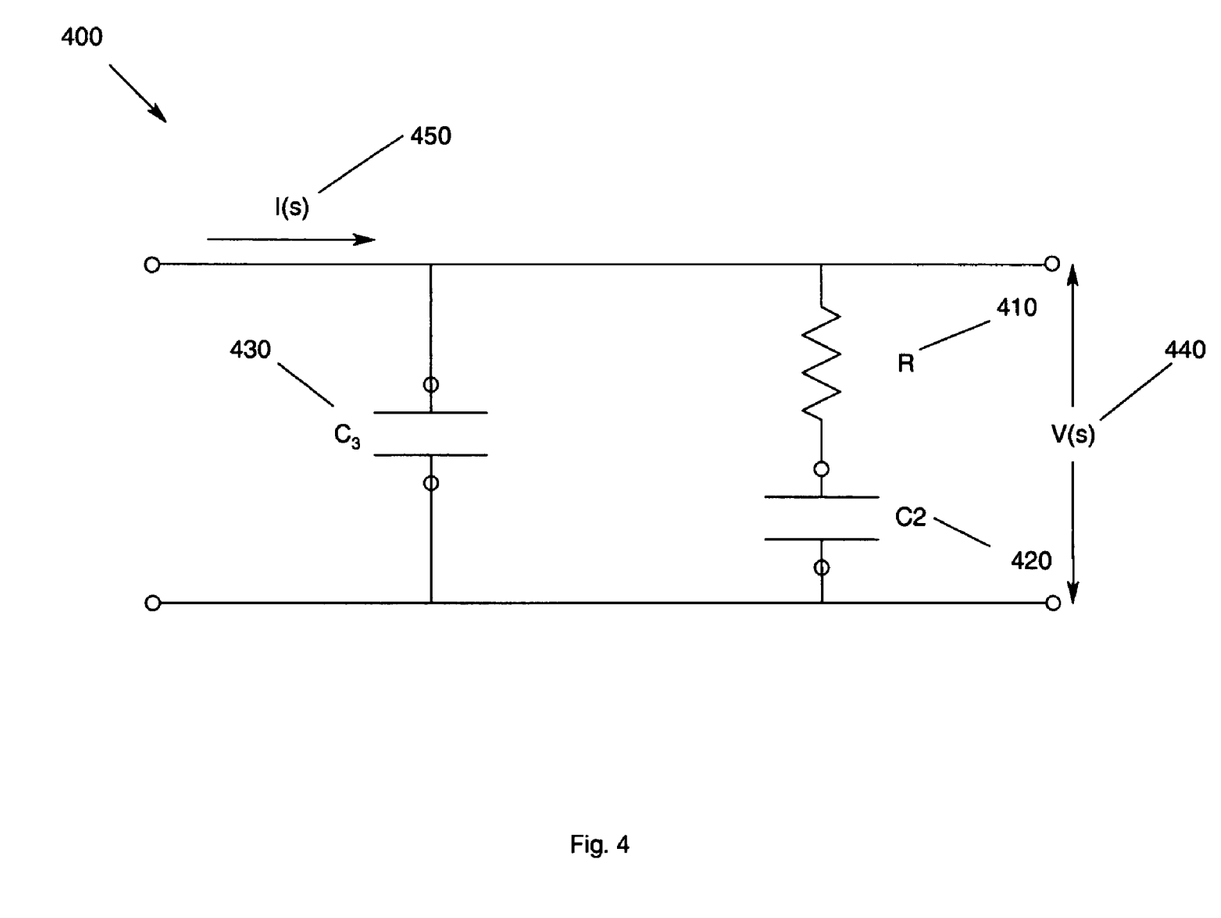
FIG. 4 illustrates a circuit diagram for the loop filter according to an embodiment of the present invention.

FIG. 4 illustrates a circuit diagram 400 for the loop filter according to an embodiment of the present invention. The loop filter includes a resistor, R 410, and capacitor, C2 420, in parallel with a single capacitor, C3 430. The loop voltage 440 is adjusted by the loop to minimized the phase difference between the phase indication signal and the reference signals based upon the current signal 450 from the charge pump. The transfer function for the loop filter may be represented by:

$$V(s) = I(s) \cdot H(s),$$

where H(s) is:

$$C_3 \| C_2 + R,$$

$$\frac{\left(R + \frac{1}{C_2 s}\right)\left(\frac{1}{C_3 s}\right)}{R + \frac{1}{C_2 s} + \frac{1}{C_3 s}}, \quad \frac{\left(R + \frac{1}{C_2 s}\right)\left(\frac{1}{C_3 s}\right)}{R + \frac{1}{C_2 s} + \frac{1}{C_3 s}} \cdot \frac{\frac{1}{R}}{\frac{1}{R}}, \quad \frac{\left(1 + \frac{1}{RC_2 s}\right)\left(\frac{1}{C_3 s}\right)}{1 + \frac{1}{RC_2 s} + \frac{1}{RC_3 s}}.$$

Now, the transfer function for the loop filter may be written:

$$V(s) = I(s) \cdot \frac{\left(1 + \frac{1}{RC_2 s}\right)\left(\frac{1}{C_3 s}\right)}{1 + \frac{1}{RC_2 s} + \frac{1}{RC_3 s}},$$

$$V(s)\left[1 + \frac{1}{RC_2 s} + \frac{1}{RC_3 s}\right] = I(s)\left[\left(1 + \frac{1}{RC_2 s}\right)\left(\frac{1}{C_3 s}\right)\right],$$

$$V(s) = I(s)\left[\left(1 + \frac{1}{RC_2 s}\right)\left(\frac{1}{C_3 s}\right)\right] - V(s) \cdot \left[\frac{1}{RC_2 s} + \frac{1}{RC_3 s}\right].$$

Figure 5:
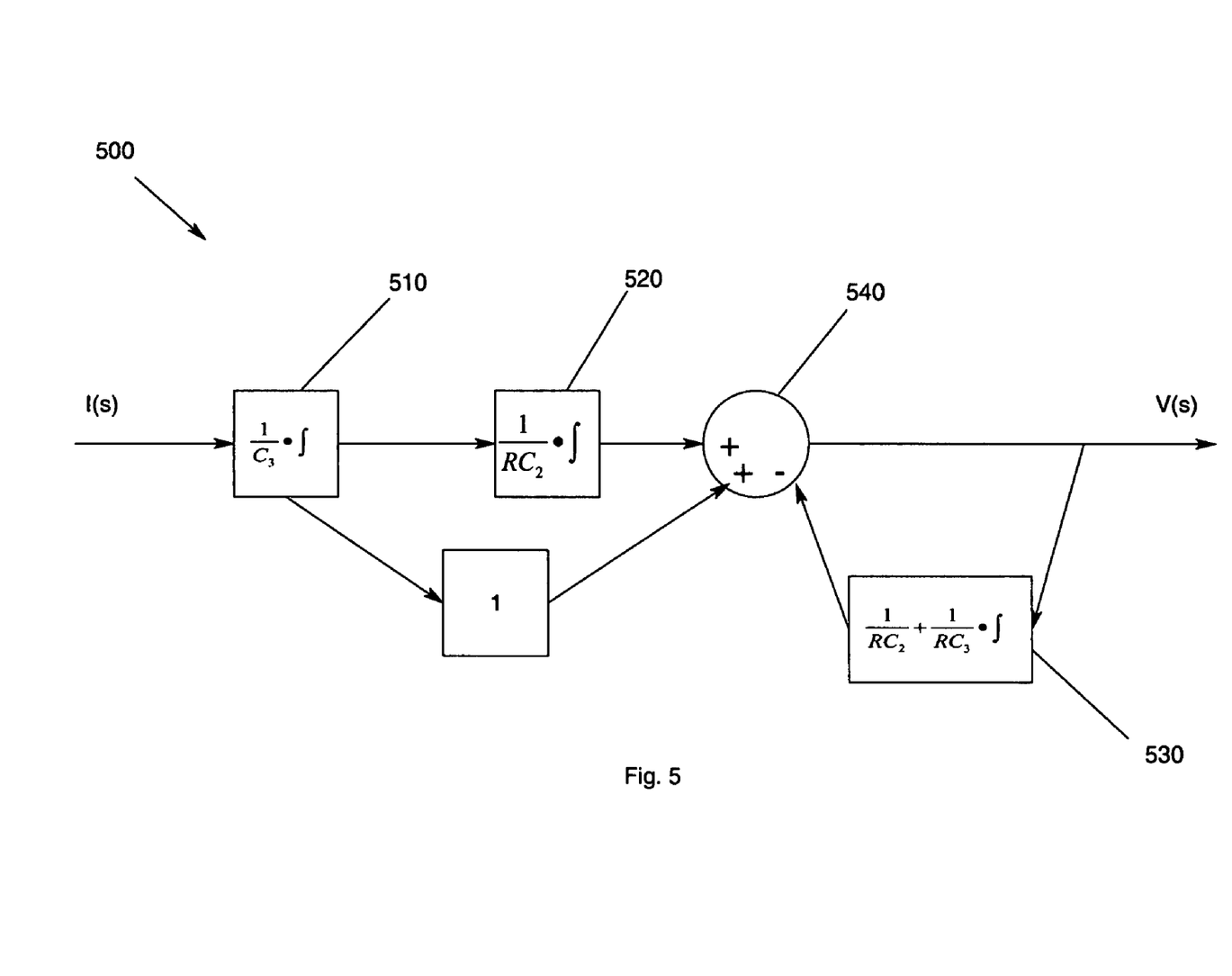
FIG. 5 is a block diagram of the loop filter based upon the derived transfer function.

FIG. 5 is a block diagram 500 of the loop filter based upon the derived transfer function. Thus, from FIG. 5, it can bee seen that the loop filter is a series of integrators based upon the values of R, $C_2$ and $C_3$. The combination of the first 510 and second 520 integrator generates the first parameter of the transfer function, $$\left(1 + \frac{1}{RC_2 s}\right)\left(\frac{1}{C_3 s}\right).$$

The third integrator 530 generates the second parameter of the transfer function, $$\frac{1}{RC_2 s} + \frac{1}{RC_3 s}.$$

The summing node 540 provides the proper sign to the summation so that the output of the summing node 540 processed through the third integrator 530 is subtracted.

This implementation models the PLL behavior using actual circuit parameters and produces accurate behavior in a fraction of the time required using an analog simulator. Furthermore, the model may be written in a high level description language, such as Verilog HDL (for example, see the Appendix).

Figure 6:
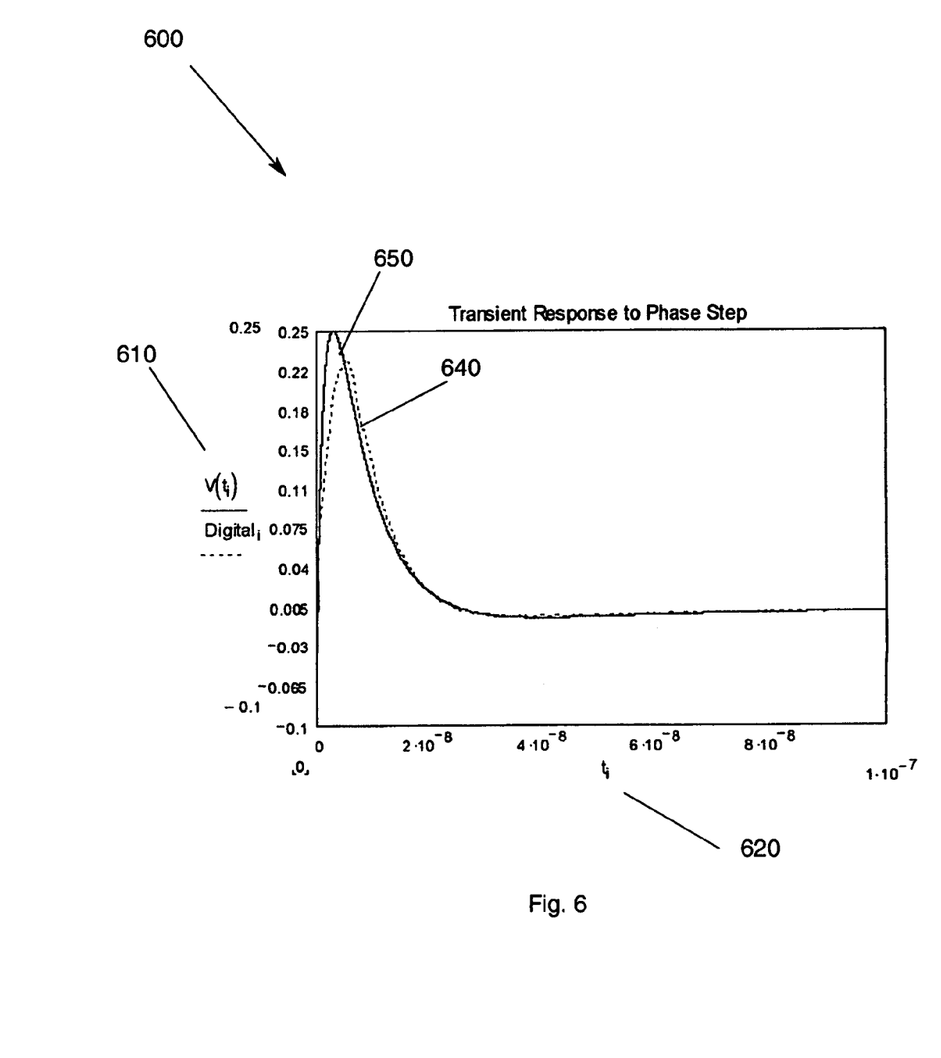
FIG. 6 is a plot of the transient response of the loop voltage versus phase step according to an embodiment of the present invention.

FIG. 6 is a plot 600 of the transient response of the loop voltage 610 versus phase step 620 according to an embodiment of the present invention. This plot 600 demonstrates the loop voltage response to a 1 radian phase step of the desired response 650 to an actual response 640.

Figure 7:
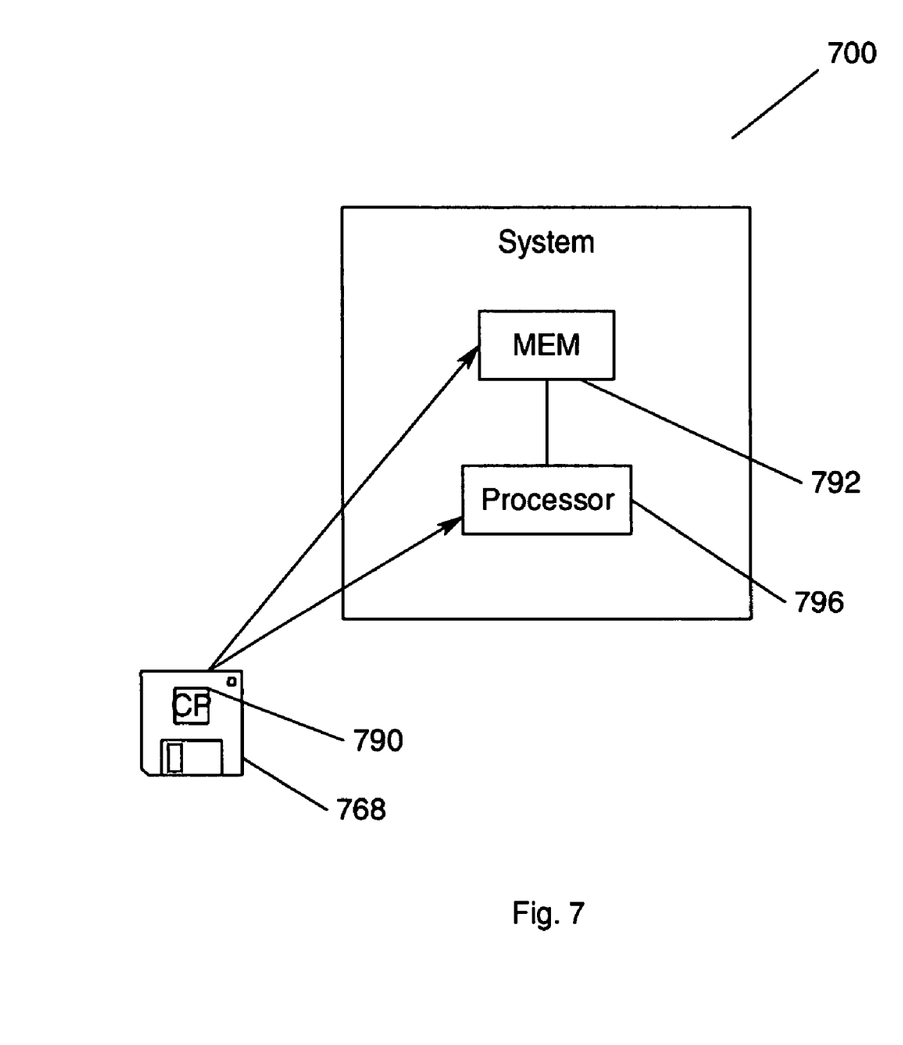
FIG. 7 illustrates a system and computer-readable medium or carrier for providing channel bonding and clock correction in field programmable gate arrays according to an embodiment of the present invention.

FIG. 7 illustrates a system 700 according to an embodiment of the present invention, wherein the process illustrated with reference to FIGS. 2-6 may be tangibly embodied in a computer-readable medium or carrier, e.g. one or more of the fixed and/or removable data storage devices 768 illustrated in FIG. 7, or other data storage or data communications devices. A computer program 790 expressing the processes embodied on the removable data storage devices 768 may be loaded into the memory 792 or processor 796, e.g., in a processor (not shown), to configure the system 700 of FIG. 7, for execution. The memory 792 may include design specifications for simulating and/or constructing a phase locked loop as illustrated with reference to FIGS. 2-6. The computer program 790 comprise instructions which, when read and executed by the system 700 of FIG. 7, causes the system 700 to perform the steps necessary to execute the steps or elements of embodiments of the present invention.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

APPENDIX

```
`timescale 1ps/1ps
`define SAMPLE_RATE        2.0       //1 ps min
`define CENTER_FREQUENCY             5.0       //G Hz
`define VCO_GAIN           1.2       //1G Hz/volt @ 5G
`define CP_GAIN            320e-6    //amps
`define LF_CAP3                      0.2e-12   //farads
```

APPENDIX-continued

```
`define LF_CAP2            6.0e-12   //farads
`define LF_R               6200.0    //ohms
`define PFD_div            16
//---------------------------------------------------------------
module vco(clk);
output clk;
reg clk;
real loop_voltage;              // 0 = CENTER_FREQUENCY
`define step  ((2.0 * `SAMPLE_RATE * `CENTER_FREQUENCY ) / 1000.0)
`define gain  ((2.0 * `SAMPLE_RATE * `VCO_GAIN )   / 1000.0)
real integrator;
initial begin
        clk <= 0;
        integrator <= 1.0;
end
always begin    //half cycle process
        # `SAMPLE_RATE          //ps
        if (integrator <= 0.0) begin
//NOTE: The remainder is retained here.
                integrator <= integrator + 1.0 - `step - (loop_voltage * `gain);
//              integrator <= 1.0 - `step - (loop_voltage * `gain);
                clk = ~clk;
                end //if
        else integrator <= integrator - `step - (loop_voltage * `gain);
end //always
endmodule
//---------------------------------------------------------------
module lf;
real loop_filter;
real int1,int2,int3;        //
real scale;
`define SAMPLE_TIME        `SAMPLE_RATE * 1e-12  //1 ps min
`define int1_step (`SAMPLE_TIME * loop_filter)
`define int2_step (`SAMPLE_TIME * int1)
`define int3_step (`SAMPLE_TIME * vco1.loop_voltage)
initial begin
        int1 <= 0.0;
        int2 <= 0.0;
        int3 <= 0.0;
        end //initial
always @(int2 or int3 or int1 or scale) begin
                vco1.loop_voltage <= int2 + scale - int3;
                end
always begin
        # `SAMPLE_RATE                          //ps
                int3 = ((( 1/ (`LF_CAP3 * `LF_R)) + (1/(`LF_CAP2 * `LF_R ))) * `int3_step) +
                int3;
                scale = 1.0 * int1;
                int2 = (`int2_step / (`LF_R * `LF_CAP2)) + int2;
                int1 = (`int1.step / `LF_CAP3 )+ int1;
end //always
endmodule
//---------------------------------------------------------------
module cp(up,dn);
input up,dn;
initial lf1.loop_filter = 0;
always @(up or dn) begin
                if       (up && !dn)     lf1.loop_filter <= `CP_GAIN;
                else if  (dn && !up)     lf1.loop_filter <= -`CP_GAIN;
                else lf1.loop_filter <= 0.0;
end //always
endmodule
//---------------------------------------------------------------
module divide4_5(phclk,clk);
input clk;
output phclk;
reg phclk;
integer count;
initial count <= `PFD_div/2;
always @(posedge clk) begin
        if (count < `PFD_div) count <= count + 1;
        else count = 1;
        if (count < `PFD_div/2) phclk = 1;
        else phclk = 0;
end //always
endmodule
//---------------------------------------------------------------
module pfd(up, phclk, dn, rclk,lockdet);
output up;
```

APPENDIX-continued

```
input phclk;
output dn;
input rclk;
input lockdet;
    reg set_up;
    reg set_dn;
    reg up_val, dn_val;
    reg reset;
parameter reset_delay = 10;
wire            up_and = set_up & up_val & ~lockdet;
wire            dn_and = set_dn & dn_val & ~lockdet;
assign dn = dn_and;
assign up = up_and;
initial begin
set_up=0;
set_dn=0;
up_val=0;
dn_val=0;
end
always @(rclk or phclk or reset or set_up or set_dn or
            dn_val or up_val) begin
        reset <= #reset_delay (up_val && dn_val && set_up && set_dn);
        if (rclk ) //latch
            set_up <= 1;
        else if (reset || !up_val)
            set_up <= 0;
        if (phclk ) //latch
            set_dn <= 1;
        else if (reset || !dn_val)
            set_dn <= 0;
        if (!set_up) //up latch
            up_val <= 1 ;
        else if (reset )
            up_val <= 0 ;
        if (!set_dn) //down latch
            dn_val <= 1 ;
        else if (reset )
            dn_val <= 0 ;
end //always
endmodule
```

What is claimed is:

1. An arrangement for simulating a phase locked loop, comprising:

a behavioral model for simulating a phase locked loop as a set of behavioral blocks based upon a high level description language;

a loop filter model, used by the behavioral model, the loop filter model being implemented as a series of integrators based on a transfer function for creating a loop voltage for generating phase adjustments; and a digital simulator for outputting a prediction of a response of the phase locked loop, wherein the digital simulator simulates the behavioral model that produces a number value and simulates the loop filter model that processes the number value with the series of integrators, wherein the behavioral model comprises:

a voltage controlled oscillator model for generating a signal allowing a phase indication signal to be created;

a phase/frequency detector model for comparing a phase of a reference signal and the phase indication signal and producing phase adjustment control signals; and a charge pump model for producing the number value of a signal representing a magnitude and direction of an output current, and wherein the voltage controlled oscillator model includes an integrator that begins at an initial VCO value and changes until the VCO value equals the loop voltage, the voltage controlled oscillator model generating an output clock having a different state.

2. The arrangement for simulating the phase locked loop of claim 1, further comprising a divider model disposed between the VCO model and the phase/frequency detector for creating the VCO phase indication signal based upon the signal provided by the VCO model.

3. The arrangement for simulating the phase locked loop of claim 1, wherein the loop filter model comprises a transfer function of $V(s)=I(s)$ $$\left[\left(1+\frac{1}{RC_2s}\right)\left(\frac{1}{C_3s}\right)\right]-V(s)\left[\frac{1}{RC_2s}+\frac{1}{RC_3s}\right].$$

4. The arrangement for simulating the phase locked loop of claim 1, wherein the behavioral model and the loop filter model use circuit parameters of a hardware based phase locked loop.

5. A method for digitally simulating a phase locked loop, comprising:

simulating a phase locked loop using a behavioral model providing a set of behavioral blocks based upon a hardware description language; and providing a loop filter model implemented as a series of integrators based on a transfer function for creating a loop voltage for generating phase adjustments for use by the behavioral model, the loop filter model, wherein the simulating outputs a prediction of a response of the phase locked loop including simulating the behavioral model that generates a real number and simulating the loop filter model that processes the real number with the series of integrators, wherein the simulating a phase locked loop using a behavioral model further comprises:

providing a voltage controlled oscillator model for generating a signal allowing a phase indication signal to be created;

providing a phase/frequency detector model for comparing a phase of a reference signal and the phase indication signal and producing phase adjustment control signals; and providing a charge pump model for produces a signal representing a magnitude and direction of an output current, and wherein the providing the voltage controlled oscillator model includes providing an integrator that generates an output clock having a changed state by beginning at an initial VCO value and changing the VCO value until the VCO value equals the loop voltage.

6. The method of claim 5, further comprising providing a divider model between the VCO model and the phase/frequency detector for creating the VCO phase indication signal based upon the signal provided by the VCO model.

7. The method of claim 5, wherein the providing the loop filter model comprises providing a loop filter model having a transfer function of $$V(s) = I(s)\left[\left(1 + \frac{1}{RC_2s}\right)\left(\frac{1}{C_3s}\right)\right] - V(s) \cdot \left[\frac{1}{RC_2s} + \frac{1}{RC_3s}\right].$$

8. The method of claim 5, wherein the simulating the phase locked loop using the behavioral model and providing the loop filter model comprise using circuit parameters of a hardware based phase locked loop.

9. An article of manufacture, comprising:

a program storage medium readable by a computer, the medium tangibly embodying one or more programs of instructions executable by the computer to perform operations for accurately modeling an analog PLL for use in a high speed digital simulator, comprising:

simulating a phase locked loop using a behavioral model providing a set of behavioral blocks based upon a hardware description language; and providing a loop filter model implemented as a series of integrators based on a transfer function for creating a loop voltage for generating phase adjustments for use by the behavioral model, the loop filter model, wherein the simulating outputs a prediction of the loop voltage of the phase locked loop including simulating the behavioral model that generates a real number and simulating the loop filter model that processes the real number with the series of integrators, wherein the simulating a phase locked loop using a behavioral model further comprises:

providing a voltage controlled oscillator model for generating a signal allowing a phase indication signal to be created;

providing a phase/frequency detector model for comparing a phase of a reference signal and the phase indication signal and producing phase adjustment control signals; and providing a charge pump model for produces a signal representing a magnitude and direction of an output current, and wherein the providing the voltage controlled oscillator model includes providing an integrator that generates an output clock having a changed state by beginning at initial VCO value and changing the VCO value until the VCO value equals the loop voltage.

10. The article of manufacture of claim 9, further comprising providing a divider model between the VCO model and the phase/frequency detector for creating the VCO phase indication signal based upon the signal provided by the VCO model.

11. The article of manufacture of claim 9, wherein the providing the loop filter model comprises providing a loop filter model having a transfer function of $$V(s) = I(s)\left[\left(1 + \frac{1}{RC_2s}\right)\left(\frac{1}{C_3s}\right)\right] - V(s) \cdot \left[\frac{1}{RC_2s} + \frac{1}{RC_3s}\right].$$

12. The article of manufacture of claim 9, wherein the simulating the phase locked loop using the behavioral model and providing the loop filter model comprise using circuit parameters of a hardware based phase locked loop.

13. The article of manufacture of claim 9, wherein the hardware description language comprises VHDL or Verilog.

* * * * *